United States Patent
Mukherjee et al.

(10) Patent No.: US 8,884,655 B2
(45) Date of Patent: Nov. 11, 2014

(54) LOW-POWER VOLTAGE MODE HIGH SPEED DRIVER

(71) Applicant: Texas Instruments Incorporated, Dallas, TX (US)

(72) Inventors: Tonmoy Shankar Mukherjee, Atlanta, GA (US); Arlo Jame Aude, Atlanta, GA (US)

(73) Assignee: Texas Instruments Incorporated, Dallas, TX (US)

( * ) Notice: Subject to any disclaimer, the term of this patent is extended or adjusted under 35 U.S.C. 154(b) by 27 days.

(21) Appl. No.: 13/860,925

(22) Filed: Apr. 11, 2013

(65) Prior Publication Data

US 2014/0306737 A1    Oct. 16, 2014

(51) Int. Cl.
*H03K 5/22*    (2006.01)
*H03F 3/45*    (2006.01)

(52) U.S. Cl.
CPC ................. *H03F 3/45071* (2013.01)
USPC ............... 327/65; 327/67; 327/108

(58) Field of Classification Search
USPC ........ 327/63–65, 67, 108, 109, 111; 330/253, 330/258, 260
See application file for complete search history.

(56) References Cited

U.S. PATENT DOCUMENTS

| | | | |
|---|---|---|---|
| 4,808,853 | A | 2/1989 | Taylor |
| 5,684,419 | A | 11/1997 | Murden et al. |
| 5,914,630 | A | 6/1999 | Peterson |
| 6,472,908 | B1 | 10/2002 | Smetana |
| 7,116,945 | B2 | 10/2006 | Moloudi et al. |
| 7,282,994 | B2 | 10/2007 | Gopinathan et al. |
| 7,301,366 | B1 | 11/2007 | Devnath et al. |
| 7,433,397 | B2 | 10/2008 | Garlepp et al. |
| 7,449,949 | B2 | 11/2008 | Sohn et al. |
| 7,573,332 | B1 | 8/2009 | Kase |
| 8,638,125 | B2 * | 1/2014 | Abugharbieh et al. ......... 327/65 |
| 2011/0234318 | A1 * | 9/2011 | Abugharbieh et al. ....... 330/253 |

OTHER PUBLICATIONS

Zhan, Jing-Hong Conan et al., "Analysis and Design of Negative Impedance LC Oscillators Using Bipolar Transistors", Transactions Briefs, IEEE Transactions on Circuits and Systems, 1: Fundamental Theory and Applications, vol. 50, No. 11, Nov. 2003.

* cited by examiner

*Primary Examiner* — Long Nguyen
(74) *Attorney, Agent, or Firm* — Andrew Viger; Frederick J. Telecky, Jr.

(57) ABSTRACT

Differential voltage mode signal driver circuitry is presented in which a differential current mode amplifier input stage provides a differential signal, and an output stage includes a pair of bipolar transistors receiving the differential signal and being connected in series with a pair of cross-coupled field effect transistors that are coupled to corresponding current sources, where a negative impedance circuit is connected between the field effect transistors to substantially cancel a parasitic capacitance of a driven output circuit.

20 Claims, 4 Drawing Sheets

LOW-POWER VOLTAGE MODE HIGH SPEED DRIVER

FIELD OF THE INVENTION

The present disclosure relates to differential driver circuits and more particularly to high-speed low-power voltage mode differential signal drivers.

BACKGROUND

High-speed digital communication relies upon driver circuitry to convey digital signals between circuit board components, through cables or in other wireline applications to provide signals for processing by receiver circuits. Differential drivers typically have either current mode or voltage mode output stages, and may be used for driving signals in a typical 50 ohm wireline or in other applications. Current mode drivers typically include a pair of transistors connected between a power supply and a current source, with the transistor gates receiving a differential input signal and the collectors driving a differential current output that can be converted to a voltage by a passive or active network, such as a simple resistor for many wireline applications. Although current mode drivers typically have good harmonic response and line impedance matching, these circuits generally suffer from high power consumption. Voltage mode drivers can be constructed as a simple emitter follower configuration, and offer reduced power consumption compared with current mode drivers, but may have poorer harmonic response and line impedance matching. As data rates continued to increase, further improvements are needed for wireline differential signal drivers that provide the low power consumption advantages of voltage mode drivers for higher speed applications.

SUMMARY

The present disclosure provides high speed, low power voltage mode differential signal driver apparatus which utilizes a cross-coupled transistor pair attached to the driver output stage, with an additional impedance circuit connected between the cross-coupled transistor pair and corresponding current sources to at least partially cancel a parasitic capacitance of a circuit driven by the signal driver apparatus. Signal driver apparatus is illustrated and described below, which includes an input circuit receiving the differential input signal and providing a differential output signal to a driver output circuit. The driver output circuit includes first and second circuit branches individually including two transistors, an intervening resistor and a current source coupled between a power supply node and a ground node, with lower transistors of each circuit branch forming a cross-coupled transistor pair. An RC impedance circuit is connected between corresponding nodes of the first and second circuit branches between the cross-coupled transistor pair and the current sources. By this approach, the RC impedance circuit appears as a negative impedance which can be used to cancel out some or all of the stray or parasitic capacitance of a driven circuit, and thus the disclosed driver apparatus can support high operating speeds and improved edge rate performance compared with conventional driver circuits, while maintaining the low-power advantages of voltage mode driver configurations.

In accordance with one or more aspects of the present disclosure, a driver apparatus is provided which includes an input circuit with first and second transistors having control terminals receiving a differential input signal and corresponding output terminals providing a differential output signal. In certain embodiments, the first and second transistors are bipolar transistors and resistors are individually coupled between the first and second transistors and a power supply node or a reference voltage node. In certain embodiments, moreover, the input circuit may include an emitter resistance and an emitter capacitance coupled in parallel with one another between the respective first and second transistors and an input current source, with optional inductors being connected between the power supply node and the input circuit transistors.

The driver apparatus further includes a driver output circuit with a first circuit branch including a third transistor connected between a power supply node and a first circuit node, where the third transistor has a control terminal coupled with the first current mode amplifier output node. A first resistor is connected between the first node and a first driver output terminal, a fourth transistor is coupled between the first driver output terminal and a second node, and a first current source is coupled between the second node and a circuit ground. A second circuit branch of the driver output circuit includes a fifth transistor coupled between the power supply and a third node with a fifth transistor control terminal coupled with the second current mode amplifier output node. A second resistor is connected between the third node and a second driver output terminal, with a sixth transistor coupled between the second driver output terminal and a fourth node, and a second current source coupled between the fourth node and the ground node. The fourth and sixth transistors form a cross-coupled transistor pair, with the fourth transistor having a control terminal coupled with the third node of the second circuit branch and the sixth transistor having a control terminal coupled with the first node of the first circuit branch.

In addition, the driver output circuit includes an RC impedance circuit connected between the second node of the first circuit branch and the fourth node of the second circuit branch. The impedance circuit in certain implementations substantially cancels a parasitic capacitance of a circuit driven by the signal driver apparatus, where a capacitance of the RC impedance circuit in certain implementations has a value of the same order of magnitude as the parasitic capacitance. In certain embodiments, the impedance circuit includes a third resistor coupled between the second node and the fourth node, as well as a capacitance coupled in parallel with the third resistor. In certain embodiments the third and fifth transistors are bipolar transistors, such as NPN transistors, and the fourth and sixth transistors are field effect transistors, such as N-channel FETs.

Certain embodiments of the driver apparatus include a common mode voltage compensation circuit coupled with the driver output circuit to sense a common mode driver output voltage and to adjust the differential current mode amplifier output signal in response to the common mode driver output voltage. In certain implementations, resistors are connected in series between the first and second driver output terminals, and an analog amplifier senses the output common mode voltage at a center node joining these resistors and compares this to a reference voltage to provide an output forming a voltage reference for the input circuit. In other implementations, the amplifier provides an output to drive shunt current sources connected to the current mode amplifier output nodes.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
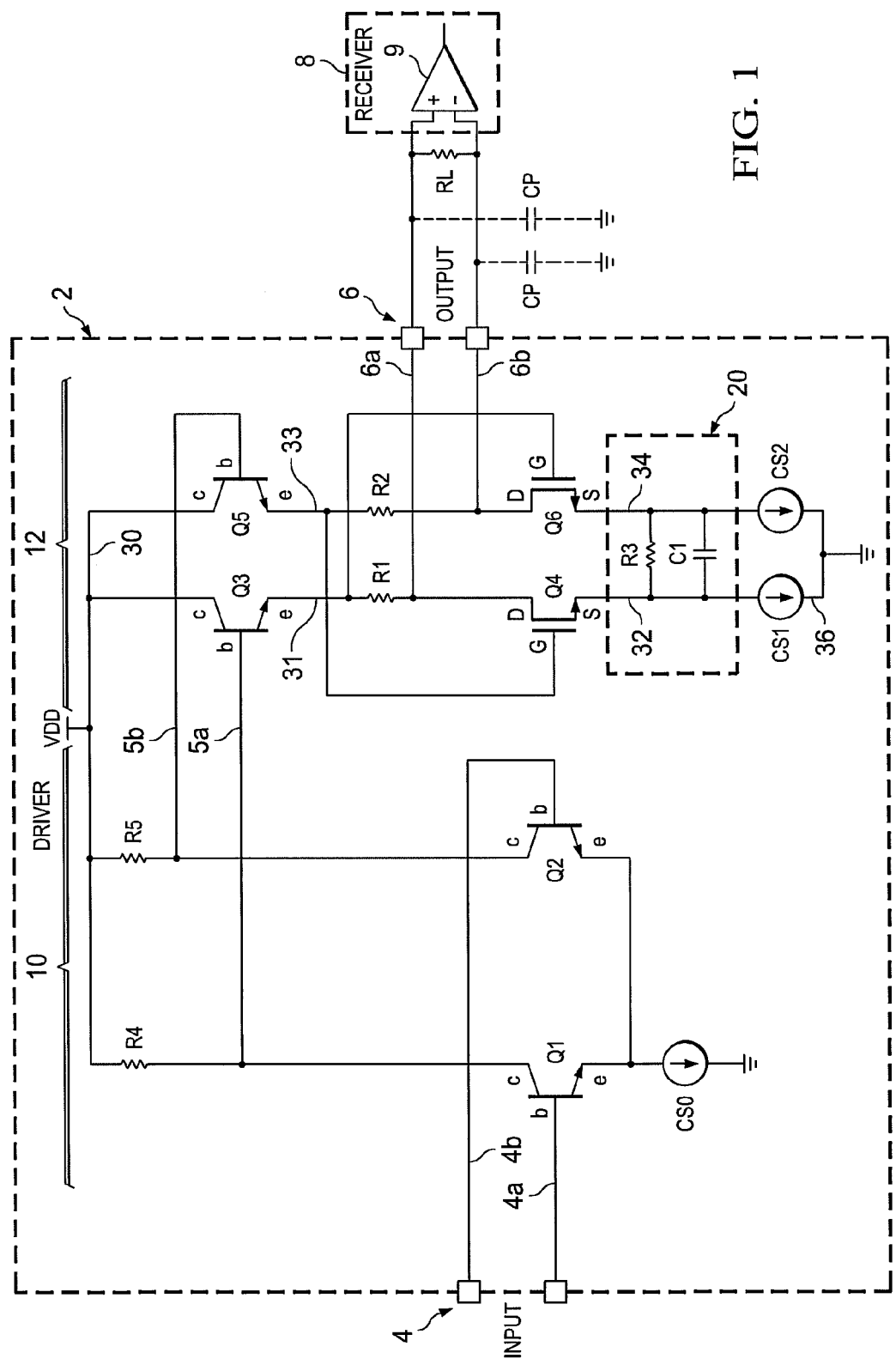
FIG. 1 is a schematic diagram illustrating an exemplary high-speed, low power differential voltage mode driver circuit with an output circuit including a cross-coupled transistor pair and a negative impedance circuit according to one or more aspects of the present disclosure.

One or more embodiments or implementations are hereinafter described in conjunction with the drawings, wherein like reference numerals are used to refer to like elements throughout, and wherein the various features are not necessarily drawn to scale. The present disclosure provides low power, high-speed voltage mode differential driver apparatus and techniques for improving high-speed operation while achieving low power signal driver operation.

FIG. 1 illustrates a low power, high speed differential voltage mode signal driver apparatus embodiment 2 with a differential input 4 for receiving a differential input signal via first and second driver input terminals 4a and 4b, respectively, as well as a differential output 6 with the output terminals 6a and 6b. The driver 2 provides a differential output signal at the output 6 for transmission through a wireline medium with a load resistance RL and parasitic line capacitances CP for ultimate receipt and processing by a receiver 8 with a differential amplifier 9. The apparatus 2 includes an input or pre-driver stage 10 receiving the differential input signal via terminals 4a and 4b as well as an output stage 12 providing a differential output via terminals 6a and 6b.

Figure 2:
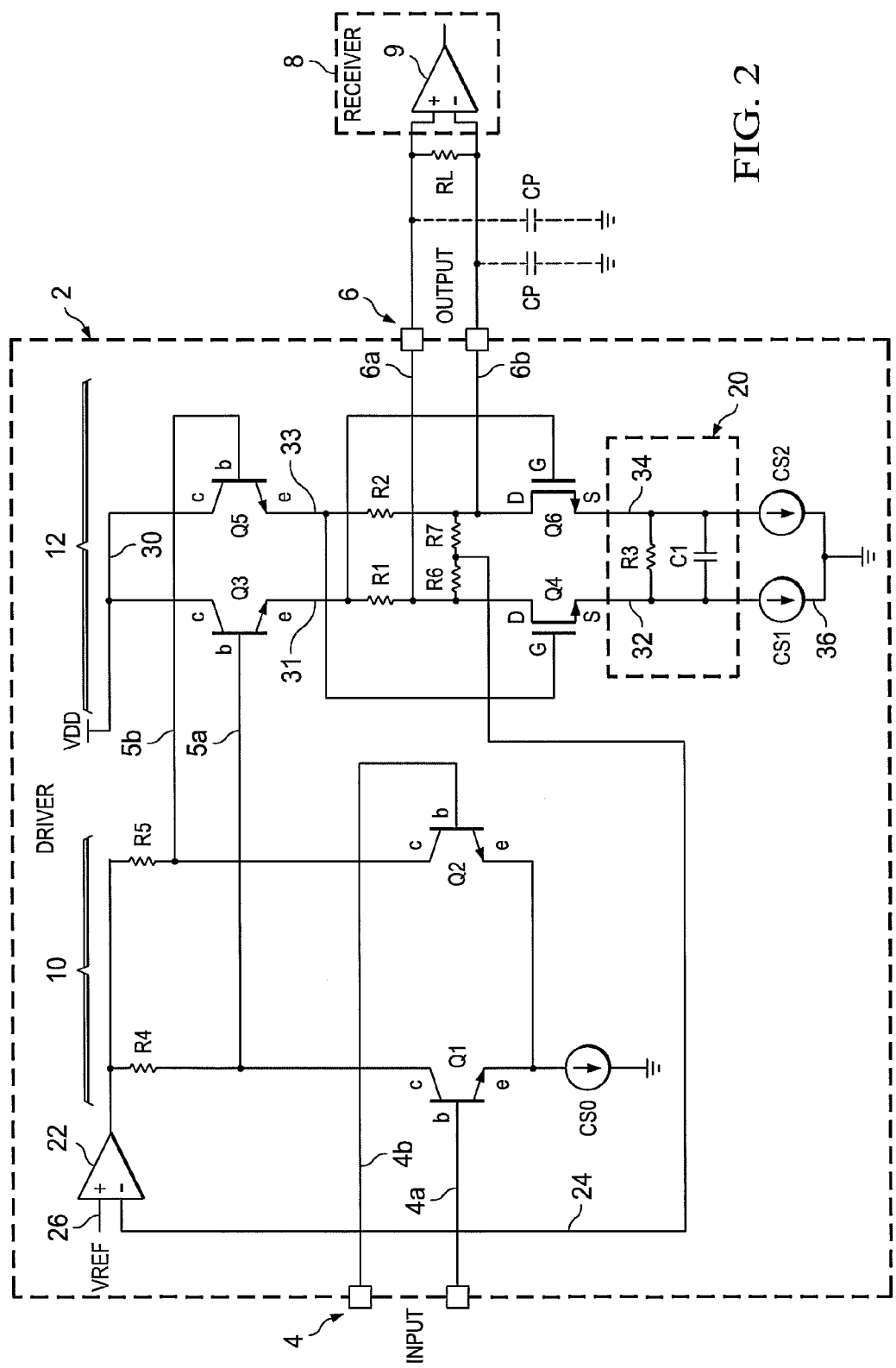
FIG. 2 is a schematic diagram illustrating another differential voltage mode driver circuit embodiment with common mode compensation circuitry providing a reference voltage to the driver input stage in accordance with the present disclosure.

The input stage 10 includes first and second transistors Q1 and Q2 with base control terminals b coupled to receive the differential input from the input terminals 4a and 4b, and emitter terminals e connected to a current source CS0 as shown. A resistor R4 is coupled between a collector c of Q1 and a power supply node 30 (VDD), and the collector of Q2 is connected through a resistor R5 to VDD. Q1 and Q2 form a current mode amplifier configuration that receives a differential input signal from the input 4, with the collector output terminals of Q1 and Q2 providing a differential current mode amplifier output signal at nodes 5a and 5b. Although Q1 and Q2 in the illustrated embodiments are NPN bipolar transistors, other types of transistors can be used to form a current mode amplifier in the input circuit 10. In certain embodiments, moreover, the resistors R4 and R5 can be connected to a separate reference node, for example to facilitate common mode adjustment of the input stage 10 as seen in FIG. 2 below.

Figure 3:
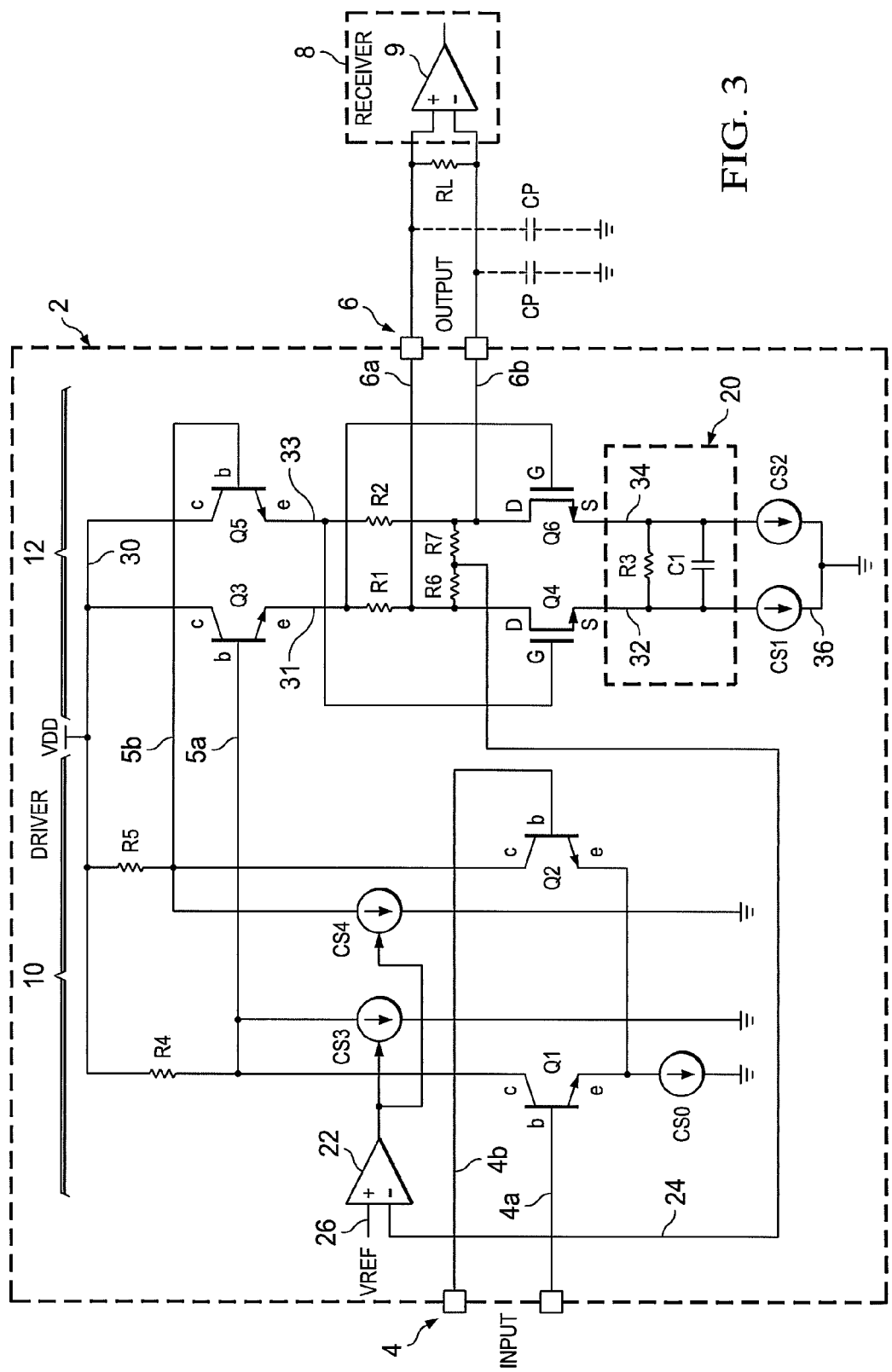
FIG. 3 is a schematic diagram illustrating another differential voltage mode driver circuit embodiment including common mode compensation circuitry controlling shunt current sources in the input stage.
Figure 4:
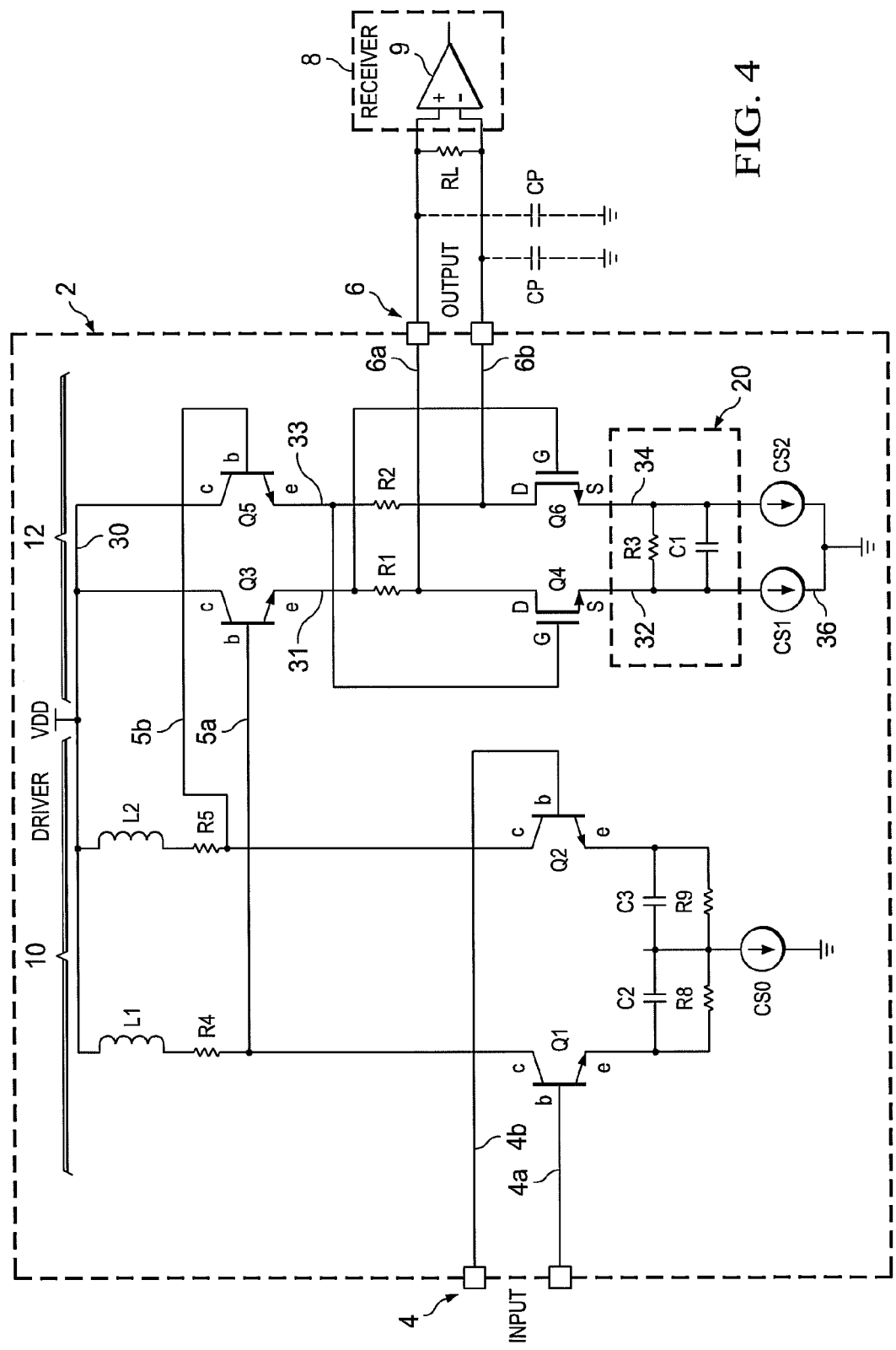
FIG. 4 is a schematic diagram illustrating still another differential voltage mode driver circuit embodiment with additional emitter impedance components for signal pre-emphasis for selective adjustment of gain according to operating frequency.

As seen in FIG. 3 below, moreover, shunt current sources CS3 and CS4 may be provided in the input circuit 10 for common mode compensation. In other embodiments, the input stage 10 may include optional inductors L1 and L2, as well as emitter resistances R8 and R9 and emitter capacitances C2 and C3 is illustrated in FIG. 4. In practice, the power consumption of the driver apparatus 2 can be controlled, at least in part, by adjustment of the resistance values of R4 and R5, with higher impedances being suitable to reduce the current consumption of the input stage 2.

As shown in FIG. 1, the driver apparatus 2 further includes an output stage 12 with a pair of upper transistors Q3 and Q5 and a lower pair of cross-coupled transistors Q4 and Q6 providing a differential output at the terminals 6a and 6b. Thus connected, the output stage 12 provides a differential voltage mode amplifier architecture, with the cross-coupled lower transistor pair Q4, Q6 facilitating low-power operation and the other benefits of voltage mode output stages for differential signal driving circuitry. In addition, as discussed further below, the output stage 12 includes an RC impedance network 20 with a resistor R3 and a capacitor C1 connected between the cross-coupled transistor pair and a pair of output stage current sources CS1 and CS2.

The illustrated output stage 12 includes first and second series circuit branches coupled between the power supply node VDD 30 and a circuit ground node. The first circuit branch includes an NPN bipolar transistor Q3 connected between the power supply node 30 and a first internal node 31, with a base terminal of Q1 being coupled with the first current mode amplifier output node 5a, the collector of Q3 being connected to VDD node 30, and an emitter terminal Q3 being connected to the first node 31. A resistor R1 is connected between node 31 and the first driver output terminal 6a, and an N-channel FET transistor Q4 has a drain connected to the output terminal 6a and a source connected to the first output stage current source CS1 at a second internal node 32. The second circuit branch of the output stage 12 includes an NPN transistor Q5 with a collector coupled to the power supply node 30, a base terminal connected to the second current mode amplifier output node 5b, and an emitter connected to a second resistor R2 at a third internal node 33. The lower terminal of R2 is connected to the second output terminal 6b, and another N-channel FET Q6 is connected between the second output terminal 6b and the second output stage current source CS2 as shown.

The FET transistors Q4 and Q6 form a cross-coupled transistor pair with the gate control terminal of Q6 coupled to the first node 31 of the first circuit branch, and the gate control terminal of Q4 connected to the node 33 of the second circuit branch. In operation, the differential current mode amplifier output signal of nodes 5a and 5b drive the base terminals of Q3 in Q5, and the emitters of Q3 in Q5 drive the cross-coupled gates of Q6 and Q4, respectively. In turn, the drains of the cross-coupled FET transistors Q4 and Q6 provide the output signals to the terminals 6a and 6b with load current provided via the resistances R1 and R2. The load current provided to the output 6 is supplied by the output stage current sources CS1 and CS2, and the impedance of the driven circuit RL can be matched by the values of the resistors R1 and R2 as well as the impedance looking into the emitters of Q3 and Q5. For example, a 100 ohm line impedance (RL=100Ω) can be matched by making R1=R2=approximately 50Ω. An example of a cross-coupled output stage transistor pair is illustrated and described in US Patent Application Publication number 2011/0234318 A1, the entirety of which is hereby Incorporated by reference. While the illustrated embodiment provides bipolar upper transistors Q3 and Q5 and field effect transistors Q4 and Q6, other embodiments are possible using different types of transistors to form the differential voltage mode amplifier output stage 12.

Unlike prior differential voltage mode amplifier output stages, the illustrated output stage 12 further includes an RC impedance circuit 20 coupled between the nodes 32 and 34 of the first and second circuit branches, respectively. As seen in FIG. 1, moreover, the impedance circuit 20 includes a resistor R3 coupled between the second node 32 and the fourth node 34, as well as a capacitance C1 coupled in parallel with the resistor R3 between the nodes 32 and 34. In certain implementations, the capacitance C1 and the resistor R3 are sized to wholly or at least partially cancel a parasitic capacitance CP of the circuit driven by the driver apparatus 2. For instance, certain embodiments of the driver 2 include a capacitance C1 which is of the same order of magnitude as the parasitic capacitance CP. Thus, due to the cross-coupling of the transistors Q4 and Q6 in the output stage 12, the impedance circuit 20 appears as a negative impedance looking into the output network from the output terminals 6. Consequently, pad and routing capacitances CP can be at least partially cancelled by the impedance circuit 20 to thereby at least partially mitigate the previous limitation on the edge rate (rise time, fall time) of data being provided to receiver circuitry 8. Moreover, the components R3 and C1 of the circuit 20 can be introduced into integrated circuit implementations of the driver apparatus 2 at minimal cost, and without significant impact on power consumption of the driver 2.

The inventors have appreciated that increased data rates and low voltage operating constraints in data driver applications render conventional driver architectures unable to meet high speed edge rate requirements with respect to rise times and fall times of the conveyed data signals. For a given fabrication process, simply increasing the power provided to the driver circuit is not a valid solution to increase operating speed. The illustrated output stage 12, in this regard, employs a MOSFET cross-coupled transistor pair Q4 and Q6 and thus does not suffer from any significant gate to drain forward bias penalty and is particularly suitable for 2.5 V or other low voltage applications. However, the inventors have further appreciated that supporting higher data rates is at least partially restricted by integrated circuit pad capacitance and/or circuit routing capacitance, represented in FIG. 1 as the parasitic capacitances CP individually connected between the output terminals 6a, 6b and ground.

As seen in FIG. 1, the RC impedance circuit 20 is configured below the cross-coupled transistor pair Q4 and Q6, and thus provides a negative transconductance which operates to wholly or partially cancel the parasitic output capacitance CP associated with the transmission medium being driven by the apparatus 2. In many applications, moreover, the RC circuit 20 can be tuned according to the parasitic capacitance CP, which itself can be accurately estimated in most applications, such as in a typical 50 ohm transmission line implementation. As shown in FIG. 1, moreover, the connection of R3 and C1 between the nodes 32 and 34 provides an AC equivalent of two series connected impedances R3/2 in parallel with 2C1, with a corner frequency at $R3/2 = \frac{1}{2}C1s$ or $s=1/R3C1$. At frequencies above the corner frequency, $R3>1/C1s$, and the AC equivalent impedance becomes approximately $\frac{1}{2}C1s$. The resistance R3, moreover, can be set according to these relationships to provide a desired corner frequency, as well as to adjust the gain of the output stage 12.

As positioned between the cross-coupled transistor pair Q4, Q6 and the current sources CS1 and CS2, moreover, the impedance circuit 20 substantially cancels the parasitic output capacitance CP. Thus, to the extent that integrated circuit metallization layer pad capacitance and other output circuit capacitance CP has previously limited the applicability of voltage mode driver circuits for higher data rates, the present disclosure advantageously facilitates complete or at least partial cancellation of such parasitic capacitance CP by providing the RC impedance circuit 20 in the output stage 12. For instance, one possible design provides an RC impedance circuit capacitance C1=150 fF for at least partially canceling a line impedance where RL=100Ω and CP=200 fF.

FIGS. 2 and 3 illustrate further embodiments, similar in most respects to the above-described implementation of FIG. 1, with the addition of common mode compensation circuitry for selective adjustment of the input stage 10 responsive to common mode driver output voltage. As seen in FIG. 2, these embodiments employ resistors R6 and R7 connected in series with one another between the driver output terminals 6a and 6b, as well as an analog amplifier 22 (e.g., op amp) with an inverting terminal 24 connected to the center point joining resistors R6 and R7 to sense a common mode voltage associated with the output 6. The amplifier 22, in turn, compares the sensed common mode voltage on line 24 with a reference voltage 26 (VREF), and the output of the amplifier 22 in FIG. 2 provides a voltage reference to resistors R4 and R5 of the input stage 10. In this manner, changes to the common mode voltage on line 24 results in adjustment of the differential current mode amplifier output signal provided by the input stage 10 at nodes 5a and 5b. For example, increase in the sensed common mode voltage at line 24 results in increase to the voltage reference provided to R4 and R5, thereby decreasing the output common mode voltage of the driver apparatus 2.

In FIG. 3, the common mode voltage compensation circuitry similarly provides sense resistors R6 and R7 connected between the output terminals 6a and 6b, with an analog amplifier 22 sensing the output common mode voltage at the node joining R6 and R7 (line 24) and comparing the common mode voltage to the reference voltage 26. In this case, however, the resistors R4 and R5 of the input stage 10 are connected to the supply node 30 (VDD), and the amplifier output is used to provide a control voltage to shunt current sources CS3 and CS4. In this example, CS3 is connected between the current mode amplifier output node 5a and ground, and CS4 is connected between the node 5b and ground. In operation of this embodiment, the current sources CS3 and CS4 are operated according to the output of the amplifier 22 to selectively shunt current from these nodes 5a and 5b to thereby adjust the differential output from the input stage 10 in response to the sensed output common mode voltage, with increasing common mode voltage online 24 causing an increase in the amount of shunt current removed from the nodes 5a and 5b by the current sources CS3 and CS4. In this case, the increased shunt current levels reduce the output common mode voltage.

FIG. 4 illustrates another driver embodiment 2, which includes emitter impedance components for signal pre-emphasis with respect to frequency. In this case, the driver 2 may optionally include inductors L1 and L2 connected between the respective resistors R4 and R5 and the power supply node 30. As shown in FIG. 4, moreover, a first emitter resistance R8 and emitter capacitance C2 are coupled in parallel with one another between the emitter of Q1 and the input stage current source CS0. Also, this embodiment includes a second emitter resistance R9 coupled in parallel with a second emitter capacitance C3 between the emitter of Q2 and CS0. The additional emitter circuit elements C2, C3, R8 and R9 provide signal pre-emphasis, such that the differential signal gain increases with increased operating frequency. In this manner, the driver 2 may further facilitate operation that higher data rates while still achieving desired edge rate performance (e.g., rise times, fall times, etc.).

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A signal driver apparatus, comprising:
    an input circuit comprising first and second transistors forming a current mode amplifier with corresponding first and second control terminals coupled to receive a differential input signal from corresponding first and second driver input terminals, and corresponding first and second output terminals coupled to provide a differential current mode amplifier output signal to first and second current mode amplifier output nodes; and
    a driver output circuit comprising:
        a first circuit branch, including a third transistor connected between a power supply node and a first node and including a third control terminal coupled with the first current mode amplifier output node, a first resistor connected between the first node and a first driver output terminal, a fourth transistor coupled between the first driver output terminal and a second node and including a fourth control terminal, and a first current source coupled between the second node and a ground node,
        a second circuit branch, including a fifth transistor coupled between the power supply node and a third node and including a fifth control terminal coupled with the second current mode amplifier output node, a second resistor connected between the third node and a second driver output terminal, a sixth transistor coupled between the second driver output terminal and a fourth node and including a sixth control terminal coupled with the first node, and a second current source coupled between the fourth node and the ground node, wherein the fourth control terminal of the fourth transistor is coupled with the third node, and
        an RC impedance circuit connected between the second node of the first circuit branch and the fourth node of the second circuit branch.

2. The signal driver apparatus of claim 1, wherein the RC impedance circuit comprises:
    a third resistor coupled between the second node and the fourth node; and
    a capacitance coupled in parallel with the third resistor between the second node and the fourth node.

3. The signal driver apparatus of claim 1, wherein the capacitance has a value of the same order of magnitude as a parasitic capacitance of a circuit driven by the signal driver apparatus.

4. The signal driver apparatus of claim 2, wherein the first transistor is coupled between a fourth resistor and an input circuit current source, and the second transistor is coupled between a fifth resistor and the input circuit current source.

5. The signal driver apparatus of claim 2, wherein the first transistor, the second transistor, the third transistor and the fifth transistor are bipolar transistors, and wherein the fourth transistor and the sixth transistor are field effect transistors.

6. The signal driver apparatus of claim 5, wherein the first transistor, the second transistor, the third transistor and the fifth transistor are NPN type bipolar transistors, and wherein the fourth transistor and the sixth transistor are N-channel field effect transistors.

7. The signal driver apparatus of claim 1, wherein the first transistor is coupled between a fourth resistor and an input circuit current source, and the second transistor is coupled between a fifth resistor and the input circuit current source.

8. The signal driver apparatus of claim 7, wherein the first transistor, the second transistor, the third transistor and the fifth transistor are NPN type bipolar transistors, and wherein the fourth transistor and the sixth transistor are N-channel field effect transistors.

9. The signal driver apparatus of claim 7, wherein the driver output circuit comprises a sixth resistor and a seventh resistor connected in series with one another between the first and second driver output terminals; further comprising an analog amplifier with an inverting input coupled to sense an output common mode voltage at a center node joining the sixth and seventh resistors, a non-inverting input coupled to a reference voltage, and an output connected to the fourth and fifth resistors.

10. The signal driver apparatus of claim 1, wherein the first transistor, the second transistor, the third transistor and the fifth transistor are NPN type bipolar transistors, and wherein the fourth transistor and the sixth transistor are N-channel field effect transistors.

11. The signal driver apparatus of claim 1, comprising a common mode voltage compensation circuit coupled with the driver output circuit to sense a common mode driver output voltage associated with the first and second driver output terminals and to adjust the differential current mode amplifier output signal in response to the common mode driver output voltage.

12. The signal driver apparatus of claim 11, wherein the common mode voltage compensation circuit comprises:
    a pair of resistors connected in series with one another between the first and second driver output terminals; and
    an analog amplifier with an inverting input coupled to sense the common mode driver output voltage at a center node joining the pair of resistors, a non-inverting input coupled to a reference voltage, and an output connected to the input circuit.

13. The signal driver apparatus of claim 11, wherein the common mode voltage compensation circuit comprises:
    a pair of resistors connected in series with one another between the first and second driver output terminals;
    an analog amplifier with an inverting input coupled to sense the common mode driver output voltage at a center node joining the pair of resistors, a non-inverting input coupled to a reference voltage, and an output;
    a third current source connected between the first current mode amplifier output node and the ground node, the third current source being controlled by the output of the analog amplifier; and
    a fourth current source connected between the second current mode amplifier output node and the ground node, the fourth current source being controlled by the output of the analog amplifier.

14. The signal driver apparatus of claim 1, wherein the input circuit comprises:
- a first series circuit comprising:
    - a first inductor and a fourth resistor coupled in series with one another between the power supply node and the first transistor, and
    - a first emitter resistance and a first emitter capacitance coupled in parallel with one another between the first transistor and an input circuit current source;
- a second series circuit comprising:
    - a second inductor and a fifth resistor coupled in series with one another between the power supply node and the second transistor, and
    - a second emitter resistance and a second emitter capacitance coupled in parallel with one another between the second transistor and the input circuit current source.

15. The signal driver apparatus of claim 1, wherein the RC impedance circuit substantially cancels a parasitic capacitance of a circuit driven by the signal driver apparatus.

16. A signal driver, comprising:
- a differential current mode amplifier coupled to receive a differential input signal and providing a differential current mode amplifier output signal;
- a pair of NPN bipolar transistors with collector terminals connected to a power supply node, and gate terminals receiving the differential current mode amplifier output signal;
- a pair of resistors coupled between emitter terminals of the pair of NPN bipolar transistors and corresponding driver output terminals;
- a pair of driver output current sources individually including a first terminal coupled with a ground node, and a second terminal;
- a pair of driver output N-channel field effect transistors individually including a drain terminal coupled to a first terminal of a corresponding one of the pair of resistors, a source terminal coupled to a corresponding one of the driver output current sources, and a gate terminal coupled to a second terminal of the other one of the pair of resistors; and
- an RC impedance circuit connected between the second terminals of the driver output current sources.

17. The signal driver of claim 16, wherein the RC impedance circuit comprises:
- a third resistor connected between the second terminals of the driver output current sources; and
- a capacitance coupled in parallel with the third resistor.

18. The signal driver of claim 17, wherein the capacitance has a value of the same order of magnitude as a parasitic capacitance of a circuit driven by the signal driver.

19. The signal driver of claim 17, wherein the capacitance substantially cancels a parasitic capacitance of a circuit driven by the signal driver.

20. The signal driver of claim 16, wherein the RC impedance circuit substantially cancels a parasitic capacitance of a circuit driven by the signal driver.

* * * * *